United States Patent
Tolson et al.

[11] Patent Number: 5,963,100
[45] Date of Patent: Oct. 5, 1999

[54] FREQUENCY SYNTHESIZER HAVING A SPEED-UP CIRCUIT

[75] Inventors: Nigel Tolson; Justin Clark, both of Berkshire, United Kingdom

[73] Assignee: NEC Corporation, Tokyo, Japan

[21] Appl. No.: 09/028,818

[22] Filed: Feb. 24, 1998

[51] Int. Cl.$^6$ ................................ H03L 7/10; H03L 7/18
[52] U.S. Cl. .................. 331/17; 331/1 A; 331/16; 331/25; 327/105; 327/156; 455/260
[58] Field of Search ................... 331/1 A, 4, 8, 331/17, 25, DIG. 2, 16, 18; 327/105, 156–159; 455/260

[56] References Cited

U.S. PATENT DOCUMENTS

| 4,980,652 | 12/1990 | Tarusawa et al. | 331/17 X |
| 5,355,098 | 10/1994 | Iwasaki | 331/14 |
| 5,389,899 | 2/1995 | Yahagi et al. | 331/10 |

FOREIGN PATENT DOCUMENTS

| 0360442 | 3/1990 | European Pat. Off. . |
| 0458269 | 11/1991 | European Pat. Off. . |
| 0579978 | 1/1994 | European Pat. Off. . |
| 0695039 | 1/1996 | European Pat. Off. . |
| 2317279 | 3/1998 | United Kingdom . |

*Primary Examiner*—David Mis
*Attorney, Agent, or Firm*—Sughrue, Mion, Zinn, Macpeak & Seas, PLLC

[57] ABSTRACT

It is an object of the present invention to provide a frequency synthesiser with a lock speed-up arrangement in a simple and effective form. In accordance with the invention there is provided a frequency synthesiser including a voltage controlled oscillator, a phase detector which receives a base frequency signal and a feedback signal derived from the output of the voltage controlled oscillator and a filter circuit connecting the output of phase detector to a frequency control voltage input of the voltage controlled oscillator, the filter circuit having a reference voltage connection, and a speed-up circuit for applying a voltage signal to the reference voltage connection when a frequency change is demanded.

8 Claims, 2 Drawing Sheets

FREQUENCY SYNTHESIZER HAVING A SPEED-UP CIRCUIT

BACKGROUND OF THE INVENTION

1. Field of the Invention

This invention relates to a frequency synthesiser for use, for example, in a communications receiver or transmitter such as a digital telephone.

2. Description of the Related Art

A GSM([Global System for Mobile Communication]) telephone, for example, may make use of a frequency synthesiser for switching between receive and transmit frequencies or for frequency hopping during either transmission or receiving. Such a frequency synthesiser will be required to hop over a 70 MHz bandwidth within one GSM time-slot (570 $\mu$S). This is difficult to achieve as the loop bandwidth of the synthesiser needs to be kept to a minimum to maintain a low r.m.s. phase noise level.

Previous attempts have been made to speed up locking of the synthesiser loop by either temporarily widening the band width of the synthesiser loop or a voltage steering technique in which an external voltage is applied to the voltage input terminal of a VCO used in the synthesiser to drive the VCO frequency quickly to a value close to the required frequency. These prior proposals have, however, not been entirely successful, as they involve the introduction of additional active components (operational amplifier, voltage controlled amplifiers or others) inside the synthesiser loop.

SUMMARY OF THE INVENTION

It is an object of the present invention to provide a frequency synthesiser with a lock speed-up arrangement in a simple and effective form.

In accordance with the invention there is provided a frequency synthesiser including a voltage controlled oscillator, a phase detector which receives a base frequency signal and a feedback signal derived from the output of the voltage controlled oscillator and a filter circuit connecting the output of phase detector to a frequency control voltage input of the voltage controlled oscillator, the filter circuit having a reference voltage connection, and a speed-up circuit for applying a voltage signal to the reference voltage connection when a frequency change is demanded.

The above and other objects, features and advantages of the present invention will become apparent from the following description with reference to the accompanying drawings which illustrate examples of the present invention.

DETAILED DESCRIPTION OF THE PREFERRED EMBODIMENTS

Figure 1:
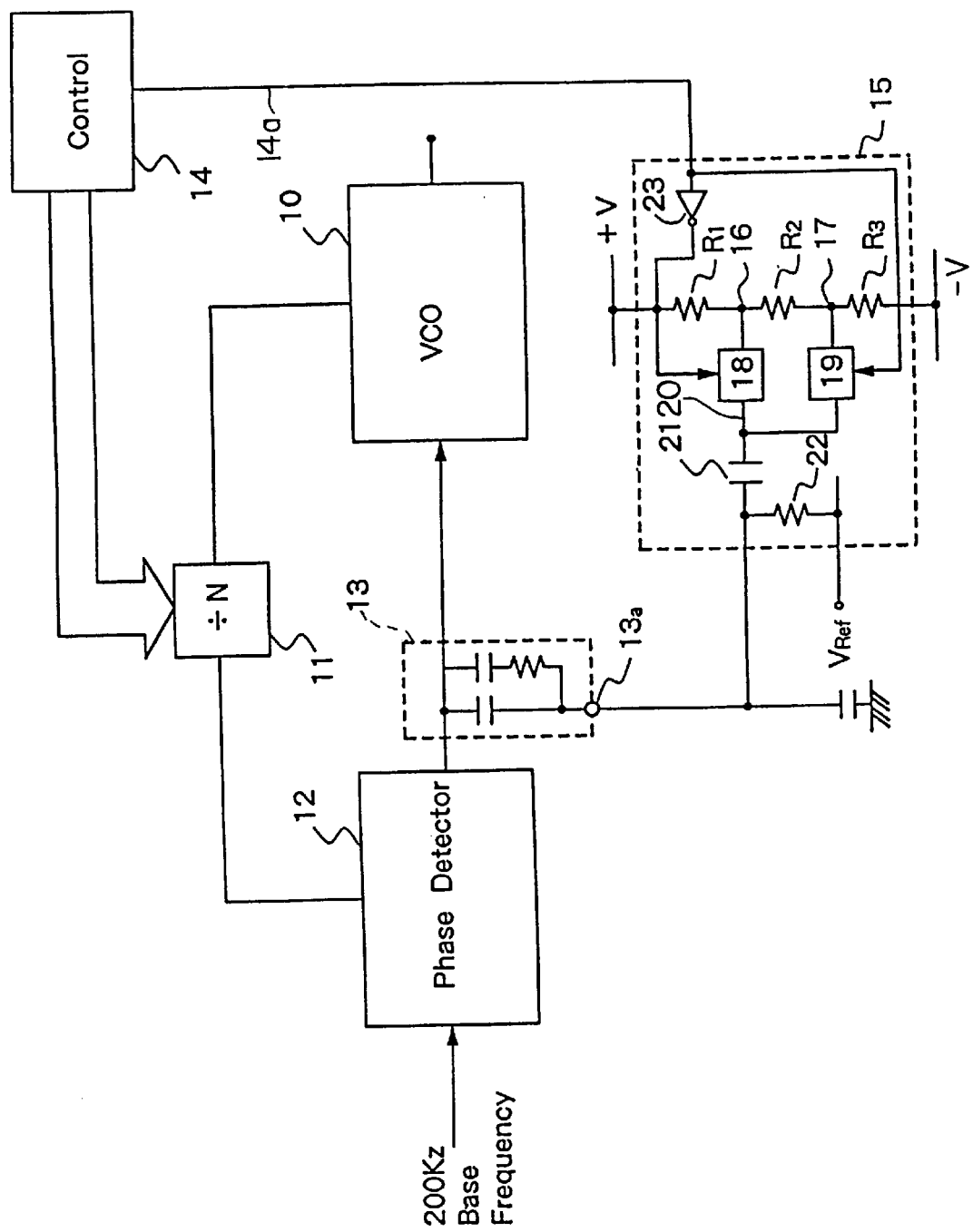
FIG. 1 is a diagram of a simple frequency synthesiser intended for operation at just two frequencies.

In the example of the invention shown in FIG. 1 of the drawings, the basic synthesiser loop comprising a voltage controlled oscillator 10, a variable frequency divider 11 providing feedback from the voltage controlled oscillator to a phase detector 12 the output voltage from which is applied by a filter circuit 13 to a frequency control voltage input of the voltage controlled oscillator. A control circuit 14 determines the frequency division ratio of the frequency divider 11.

The frequency synthesiser in accordance with the invention differs from prior frequency synthesisers in that the filter circuit 13, which operates as a narrow bandwidth low pass filter, as a voltage reference connection connected, not to a fixed voltage reference source, but to speed-up circuit 15. The speed-up circuit shown is a simple one intended for use in a situation in which it is required to switch the voltage controlled oscillator between just two different frequencies. To this end it includes a resistor chain R1, R2 and R3 connected between +V and −V supply busses to provide positive and negative voltage signals at nodes 16 and 17. Two analog switches 18 and 19 connect these nodes to an output line 20 which is connected by a capacitor 21 to the reference voltage connection 13a of the filter circuit. A resistor 22 connects the reference voltage connection 13a to the reference voltage source. An output 14a from the control circuit 14 is used to control the analog switches 18 and 19, one via a logical inverter 23.

In operation, the output 14a is high when one frequency is required and low when the other is required. The output 14a switches between its high and low states at the same time as the control output to the frequency divider 11 is changed. When a change occurs the analog switch 18 or 19 which has been conductive is blocked and the other one becomes conductive. When this occurs the positive or negative voltage signal at the appropriate one of the nodes 16, 17 is added to the reference voltage and immediately changes the voltage applied to the VCO input by an amount roughly equal to that needed for the output frequency change required. The loop can then quickly stabilise at the new frequency. The resistor 22 causes the added voltage to decay with time. The time-constant of the capacitor 21 and resistor 22 should be long compared with the filter time constants.

Figure 2:
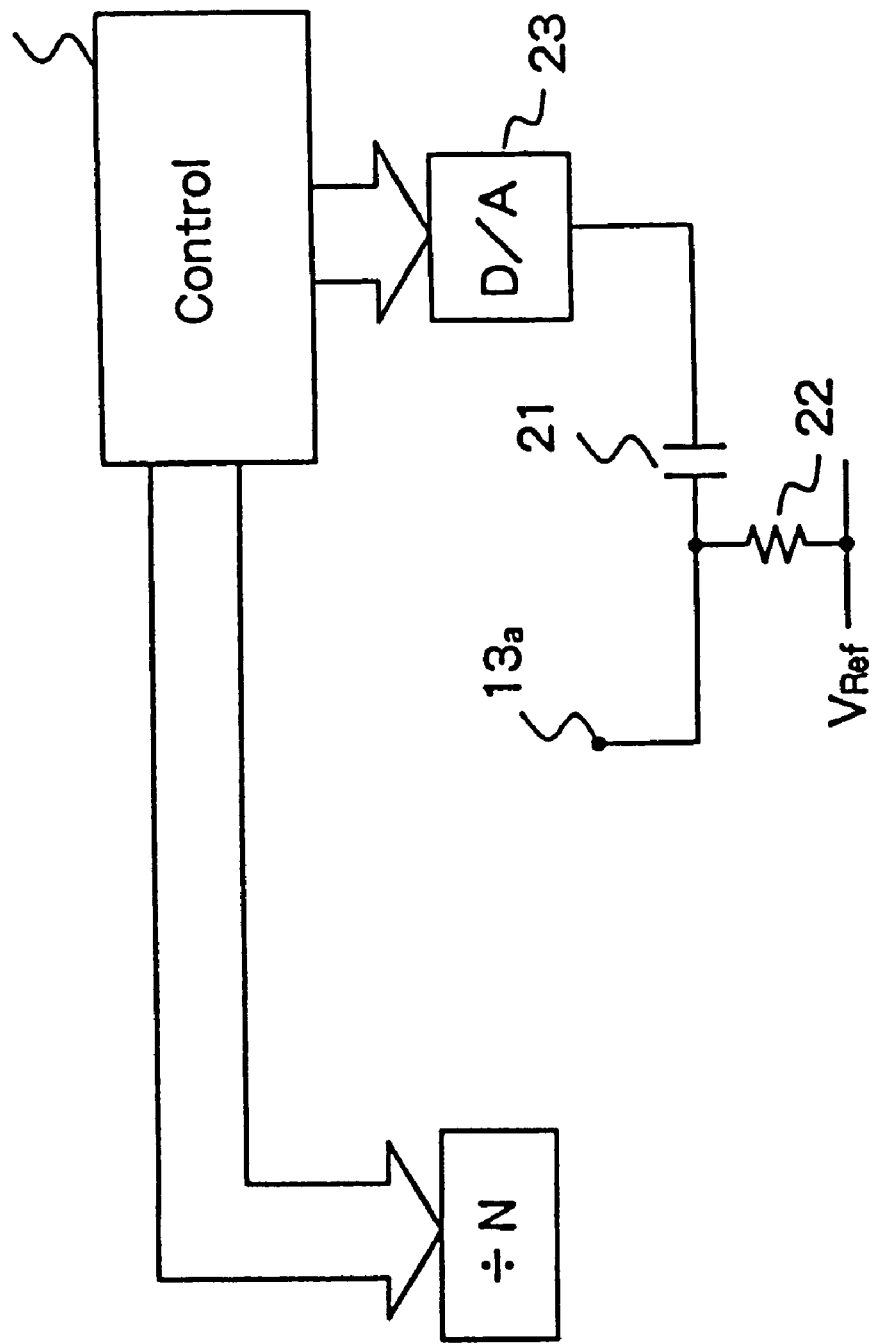
FIG. 2 is a diagram showing a modification to the example shown in FIG. 1 to enable it to operate at many different frequencies.

In a more complex embodiment shown in FIG. 2, the control unit 14 is arranged to control the frequency divider 11 to provide many different frequencies. In this case the control unit is programmed to produce a signed digital output corresponding to the difference between the old frequency and the new frequency and the speed-up circuit simply comprises an analog to digital converter 23 with its output connected by the capacitor resistor circuit 21, 22 to the connection 13a.

The speed-up circuits described above operate without any degradation of the phase noise performance of the synthesiser, because no additional active components are included in the loop. No increase in sideband level would occur because no current is leaked from the loop filter. The circuits are very simple and easy to implement in a practical system. In a mobile phone system the switch from standby operation to normal operation could be made very quickly, thereby enabling the start of synthesiser operation to be delayed and saving battery current.

While preferred embodiments of the present invention have been described using specific terms, such description is for illustrative purpose only, and it is to be understood that changes and variations may be made without departing from the spirit or scope of the following claims.

What is claimed is:

1. A frequency synthesizer comprising:
   a voltage controlled oscillator having an oscillator output;
   a phase detector which receives a base frequency signal and a feedback signal derived from said oscillator output, and which has a phase detector output;
   a filter circuit connecting said phase detector output to a frequency control voltage input of said voltage controlled oscillator, wherein said filter circuit has a reference voltage connection; and a speed-up circuit comprising an output connection capacitively coupled to said reference voltage connection of said filter circuit, and a first resistor coupled between said reference voltage connection of said filter circuit and a reference voltage source.

2. A frequency synthesizer as claimed in claim 1, in which said speed-up circuit includes a plurality of analog switch devices controlling the connection of a like number of voltage sources to said output connection of said speed-up circuit.

3. A frequency synthesizer as claimed in claim 1, in which said speed-up circuit comprises a digital to analog converter for applying to said output connection of said speed-up circuit a voltage dependent on an input digital signal.

4. A frequency synthesizer as claimed in claim 1, further comprising a frequency divider connected to provide said feedback signal to said phase detector, and a control circuit connected to said frequency divider to control a frequency division ratio of said frequency divider, said control circuit also providing a control signal to said speed-up circuit.

5. A frequency synthesizer as claimed in claim 2, further comprising a frequency divider connected to provide said feedback signal to said phase detector, and a control circuit connected to said frequency divider to control a frequency division ratio of said frequency divider, said control circuit also providing a control signal to said speed-up circuit.

6. A frequency synthesizer as claimed in claim 3, further comprising a frequency divider connected to provide said feedback signal to said phase detector, and a control circuit connected to said frequency divider to control a frequency division ratio of said frequency divider, said control circuit also providing a control signal to said speed-up circuit.

7. A frequency synthesizer as claimed in claim 1, wherein said speed-up circuit further comprises:

a second resistor, a third resistor, and a fourth resistor connected in series between two voltage sources, having a first node between said second resistor and said third resistor, and having a second node between said third resistor and said fourth resistor;

a first analog switch connected between said first node and said output connection of said speed-up circuit;

a second analog switch connected between said second node and said output connection of said speed-up circuit;

a control circuit for providing a binary control signal to said speed-up circuit in response to a frequency change request; and wherein said binary control signal is applied to said first analog switch and said second analog switch for selectively activating said first node or said second node.

8. A frequency synthesizer as claimed in claim 7, further comprising:

a frequency divider connected to said control circuit, to said voltage controlled oscillator, and to said phase detector;

wherein said control circuit controls a frequency division ratio of said frequency divider; and wherein said frequency divider provides said feedback signal to said phase detector in accordance with said frequency division ratio.

\* \* \* \* \*